US008125746B2

(12) United States Patent
Dimitrov et al.

(10) Patent No.: US 8,125,746 B2
(45) Date of Patent: Feb. 28, 2012

(54) MAGNETIC SENSOR WITH PERPENDICULAR ANISOTROPHY FREE LAYER AND SIDE SHIELDS

(75) Inventors: Dimitar V. Dimitrov, Edina, MN (US); Zheng Gao, Savage, MN (US); Wonjoon Jung, Bloomington, MN (US); Paul Edward Anderson, Eden Prairie, MN (US); Olle Gunnar Heinonen, Eden Prarie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 291 days.

(21) Appl. No.: 12/502,204

(22) Filed: Jul. 13, 2009

(65) Prior Publication Data
US 2011/0007429 A1    Jan. 13, 2011

(51) Int. Cl.
*G11B 5/127* (2006.01)
(52) U.S. Cl. .................................. 360/324.2
(58) Field of Classification Search ............... 360/324.2, 360/324.12, 324.11
See application file for complete search history.

(56) References Cited

U.S. PATENT DOCUMENTS

| 6,713,800 | B2 | 3/2004 | Chen |
| 6,943,993 | B2 | 9/2005 | Chang |
| 6,967,863 | B2 | 11/2005 | Huai |
| 6,992,359 | B2 | 1/2006 | Nguyen |
| 7,102,854 | B2 | 9/2006 | Wang |
| 2007/0026538 | A1* | 2/2007 | Jayasekara .................. 438/3 |
| 2007/0081279 | A1* | 4/2007 | Hong et al. ............... 360/324.1 |
| 2009/0257153 | A1* | 10/2009 | Liu .......................... 360/324.12 |
| 2010/0097722 | A1* | 4/2010 | Chou et al. ................... 360/245 |
| 2010/0214701 | A1* | 8/2010 | Tsuchiya et al. ........... 360/324.12 |
| 2010/0232072 | A1* | 9/2010 | Dimitrov et al. ............ 360/319 |
| 2011/0014390 | A1* | 1/2011 | Zhou et al. ................... 427/547 |

OTHER PUBLICATIONS

U.S. Appl. No. 12/017,822, filed Jan. 22, 2008, Dimitrov.

* cited by examiner

*Primary Examiner* — Allen Cao
(74) *Attorney, Agent, or Firm* — Mueting Raasch & Gebhardt PA

(57) ABSTRACT

A tunneling magneto-resistive reader includes a sensor stack separating a top magnetic shield from a bottom magnetic shield. The sensor stack includes a reference magnetic element having a reference magnetization orientation direction and a free magnetic element having a free magnetization orientation direction substantially perpendicular to the reference magnetization orientation direction. A non-magnetic spacer layer separates the reference magnetic element from the free magnetic element. A first side magnetic shield and a second side magnetic shield is disposed between the top magnetic shield from a bottom magnetic shield, and the sensor stack is between the first side magnetic shield and the second side magnetic shield. The first side magnetic shield and the second side magnetic shield electrically insulates the top magnetic shield from a bottom magnetic shield.

20 Claims, 4 Drawing Sheets

MAGNETIC SENSOR WITH PERPENDICULAR ANISOTROPHY FREE LAYER AND SIDE SHIELDS

BACKGROUND

In an electronic data storage and retrieval system, a magnetic recording head can include a reader portion having a sensor for retrieving magnetically encoded information stored on a magnetic medium. Magnetic flux from the surface of the medium causes rotation of the magnetization vector of a sensing layer or layers of the sensor, which in turn causes a change in the electrical properties of the sensor. The sensing layers are often called free layers, since the magnetization vectors of the sensing layers are free to rotate in response to external magnetic flux. The change in the electrical properties of the sensor may be detected by passing a current through the sensor and measuring a voltage across the sensor. Depending on the geometry of the device, the sense current may be passed in the plane (CIP) of the layers of the device or perpendicular to the plane (CPP) of the layers of the device. External circuitry then converts the voltage information into an appropriate format and manipulates that information as necessary to recover information encoded on the disc.

A structure in contemporary magnetic read heads is a thin film multilayer structure containing ferromagnetic material that exhibits some type of magnetoresistance. One magnetoresistive sensor configuration includes a multilayered structure formed of a nonmagnetic layer (such as a thin insulating barrier layer or a nonmagnetic metal) positioned between a synthetic antiferromagnet (SAF) and a ferromagnetic free layer, or between two ferromagnetic free layers. The resistance of the magnetic sensor depends on the relative orientations of the magnetization of the magnetic layers.

With increased recording densities, the dimensions of the magnetic sensor are decreased to sense the magnetic flux of each bit on the magnetic medium. A consequence of decreasing the size of the magnetic sensor is preserving the magnetization of the in-plane anisotropy of the magnetic layers of the magnetic sensor. For example, at smaller dimensions, the magnetization of a portion of the free layer may cant away from the anisotropic magnetization direction to minimize magnetostatic energy. The relative fraction of the region with canted magnetization may increase as the dimensions continue to decrease. In addition, changes in the canting direction caused by thermal variations or external fields may increase noise and instability in the sensor. Furthermore, when a permanent magnet is employed to bias magnetic layers in the magnetic sensor, the magnetization direction of the reference layer may be tilted off-axis, thereby reducing the signal generated by the magnetic sensor.

BRIEF SUMMARY

The present disclosure relates to a magnetic sensor with a perpendicular anisotropy free layer and side shields. The present disclosure can improve the areal density capabilities of a tunneling magneto resistive (TMR) reader.

In an embodiment, a tunneling magneto-resistive reader includes a sensor stack separating a top magnetic shield from a bottom magnetic shield. The sensor stack includes a reference magnetic element having a reference magnetization orientation direction and a free magnetic element having a free magnetization orientation direction substantially perpendicular to the reference magnetization orientation direction. A non-magnetic spacer layer separates the reference magnetic element from the free magnetic element. A first side magnetic shield and a second side magnetic shield is disposed between the top magnetic shield from a bottom magnetic shield, and the sensor stack is between the first side magnetic shield and the second side magnetic shield. The first side magnetic shield and the second side magnetic shield electrically insulates the top magnetic shield from a bottom magnetic shield.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top", "bottom", "above", "below", etc. may be used in this disclosure. These terms should not be construed as limiting the position or orientation of a structure, but should be used as providing spatial relationship between the structures. Other layers, such as seed or capping layers, are not depicted for clarity but could be included as technical need arises.

The present disclosure relates to a magnetic sensor with a perpendicular anisotropy free layer and side shields. The present disclosure can improve the areal density capabilities of a tunneling magneto resistive (TMR) reader. In addition, a number of sensor stack layer configurations are described. These sensor stack configurations improve the reader's performance. Conventional permanent magnet side shields are eliminated with the designs described herein, thus eliminating some magnetic asymmetry or canting found in the conventional permanent magnet side shield designs. While the present disclosure is not so limited, an appreciation of various aspects of the disclosure will be gained through a discussion of the examples provided below.

Figure 1:
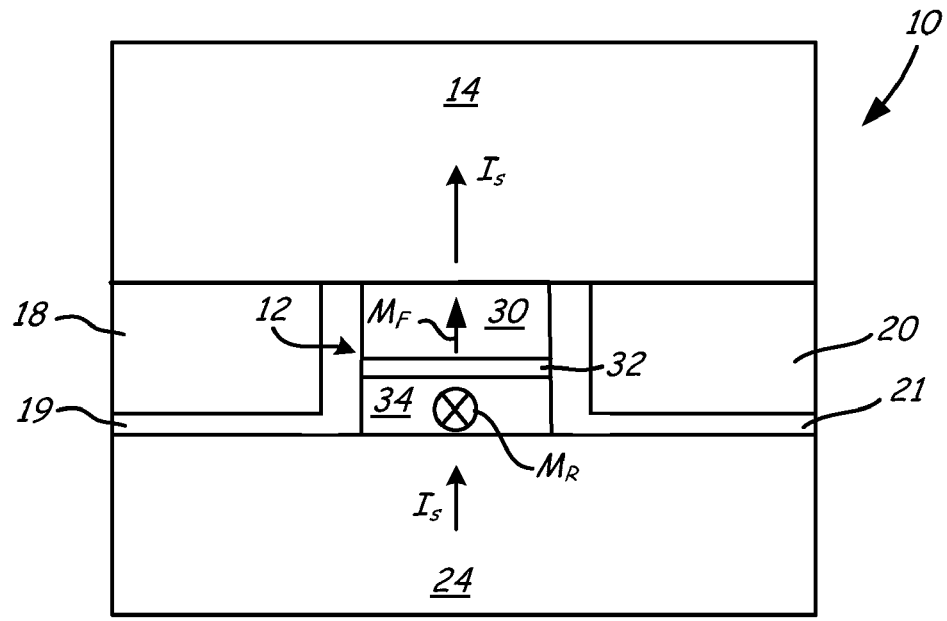
FIG. 1 is a front surface view of a tunneling magneto-resistive (TMR) reader including a free layer assembly having a perpendicular to the plane anisotropy and side shields.

FIG. 1 is a front surface view of a tunneling magneto-resistive (TMR) reader 10 including a free layer assembly 30 having a perpendicular to the plane anisotropy and side shields 18, 20. The tunneling magneto-resistive (TMR) reader 10 includes a sensor stack 12 separating a top magnetic shield 14 from a bottom magnetic shield 24. The sensor stack 12 includes a reference magnetic element 34 having a reference magnetization orientation $M_R$ direction a free magnetic element 30 having a free magnetization orientation $M_F$ direction substantially perpendicular to the reference magnetization orientation $M_R$ direction, and a non-magnetic spacer 32 layer separating the reference magnetic element 34 from the free magnetic element 30.

A first side magnetic shield 18 and a second side magnetic shield 20 are disposed between the top magnetic shield 14 and the bottom magnetic shield 24. The sensor stack 12 is between the first side magnetic shield 18 and the second side magnetic shield 20, and the first side magnetic shield 18 and the second side magnetic shield 20 include an electrically insulating layer 19, 21 electrically insulating the top magnetic shield 14 from a bottom magnetic shield 24.

In the embodiment shown, free magnetic element 30 is on the top of sensor stack 12 and reference magnetic element 34 is on the bottom of sensor stack 12. It will be appreciated that sensor stack 12 may alternatively include reference magnetic element 34 on the top of sensor stack 12 and free magnetic element 30 on the bottom of sensor stack 12.

Free magnetic element 30 is a single or a composite or multiple layer structure having a magnetization $M_F$ that rotates in response to an external magnetic field. Free magnetic element 30 has a magnetization $M_F$ with an effective direction that is perpendicular to the plane of each layer of free magnetic element 30 in a quiescent state due to the perpendicular anisotropy of the layer or layers of free magnetic element 30. While the direction of magnetization $M_F$ in a quiescent state is shown directed toward the top of sensor stack 12, the layer or layers of free magnetic element 30 may alternatively provide an effective magnetization direction that is directed toward the bottom of sensor stack 12 in a quiescent state. When free magnetic element 30 has perpendicular-to-the-plane anisotropy, canting of the magnetization proximate the edges of the layer or layers of free magnetic element 30 is prevented. This reduces noise in sensor stack 12, thereby improving the signal generated, and improves the stability of sensor stack 12.

Spacer layer 32 is a nonmagnetic layer disposed between free magnetic element 30 and reference magnetic element 34. In some embodiments, spacer layer 32 is a nonmagnetic, conductive material, such as Cu, Ag, Au, or Ru, making magnetic sensor 10 a giant magnetoresistive sensor. In other embodiments, spacer layer 32 is a non-magnetic, insulative or semi-conductive material, such as oxides formed of Mg, Al, Hf, or Ti, making magnetic sensor 10 a tunneling magnetoresistive sensor.

Reference magnetic element 34 has a fixed magnetization direction $M_R$ that is in-plane with the layer or layers of magnetic element 34. Magnetization direction $M_F$ of free magnetic element 30 is perpendicular to fixed magnetization direction $M_R$ in a quiescent state. Reference magnetic element 34 may be a single ferromagnetic layer having an anisotropically defined magnetization direction. Reference magnetic element 34 may also include various combinations of layers to provide magnetization $M_R$ having a fixed direction, such as a ferromagnetic pinned layer with an antiferromagnetic pinning layer, a synthetic ferromagnetic pinned layer (i.e., two ferromagnetic layers coupled by a nonmagnetic metal, such as Ru), or a synthetic ferromagnetic pinned layer coupled to an antiferromagnetic pinning layer. Ferromagnetic layers of reference layer assembly 34 may be made of a ferromagnetic alloy, such as CoFe, NiFe, or NiFeCo, and the antiferromagnetic layer may be made of PtMn, IrMn, NiMn, or FeMn. In an alternative embodiment, reference magnetic element 34 is replaced by a second free layer assembly having perpendicular-to-the-plane anisotropy.

In operation, sense current $I_S$ is passed through sensor stack 12 via leads/shields 14 and 24 such that the sense current $I_S$ passes perpendicular to the plane of the layer or layers of sensor stack 12. As magnetization $M_F$ rotates in response to external magnetic fields, the resistance of sensor stack 12 changes as a function of the angle between magnetizations $M_F$ and $M_R$. The voltage across sensor stack 12 is measured between leads/shields 14 and 24 by external circuitry (not shown) to detect changes in resistance of sensor stack 12. The response of sensor stack 12 to external magnetic fields, and the corresponding changes in resistance across sensor stack 12, is shown and described with regard to FIG. 2.

Figure 2:
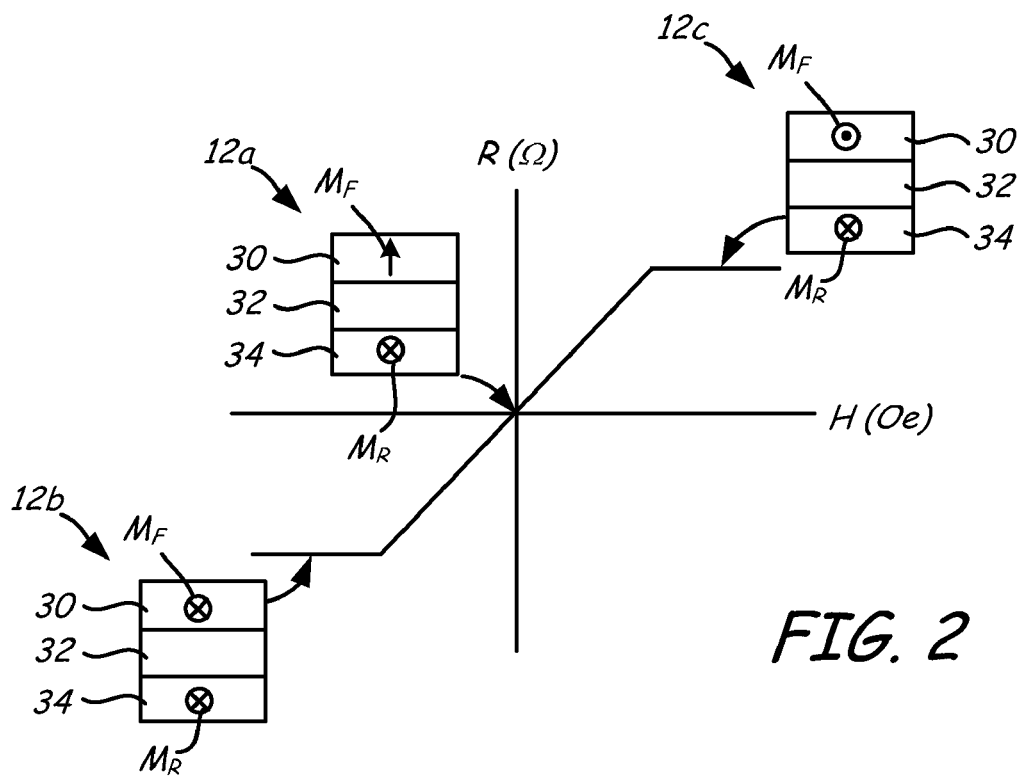
FIG. 2 is a graph showing the resistance across the tunneling magneto-resistive (TMR) reader as a function of the magnetic state of the free layer element.

FIG. 2 is a graph showing the resistance across the tunneling magneto-resistive (TMR) reader 12 as a function of the magnetization orientation $M_F$ of the free layer element 30. Layer diagrams 12a, 12b, and 12c illustrate the various magnetic states of sensor stack 12 as viewed from the front surface. Layer diagram 12a illustrates the states of magnetization $M_F$ and magnetization $M_R$ in a quiescent state (i.e., no external magnetic field), in which magnetization $M_F$ is perpendicular to the plane of free layer element 30. In this state, the readback voltage across sensor stack 12 is approximately zero.

Layer diagram 12b illustrates the states of magnetization $M_F$ and magnetization $M_R$ when sensor stack 12 is in the presence of an external magnetic field having a first direction. The external magnetic field causes magnetization $M_F$ to rotate such that magnetization $M_F$ is parallel with magnetization $M_R$. In this state, the voltage drop across sensor stack 12 is negative when sense current $I_S$ is applied, which is plotted below the zero resistance line in FIG. 2.

Layer diagram 12c illustrates the states of magnetization $M_F$ and magnetization $M_R$ when sensor stack 12 is in the presence of an external magnetic field having a second direction opposite the first direction. The external magnetic field causes magnetization $M_F$ to rotate such that magnetization $M_F$ is anti-parallel with magnetization $M_R$. In this state, the voltage drop across sensor stack 12 is positive when sense current $I_S$ is applied, which is plotted above the zero resistance line in FIG. 2.

Figure 3:
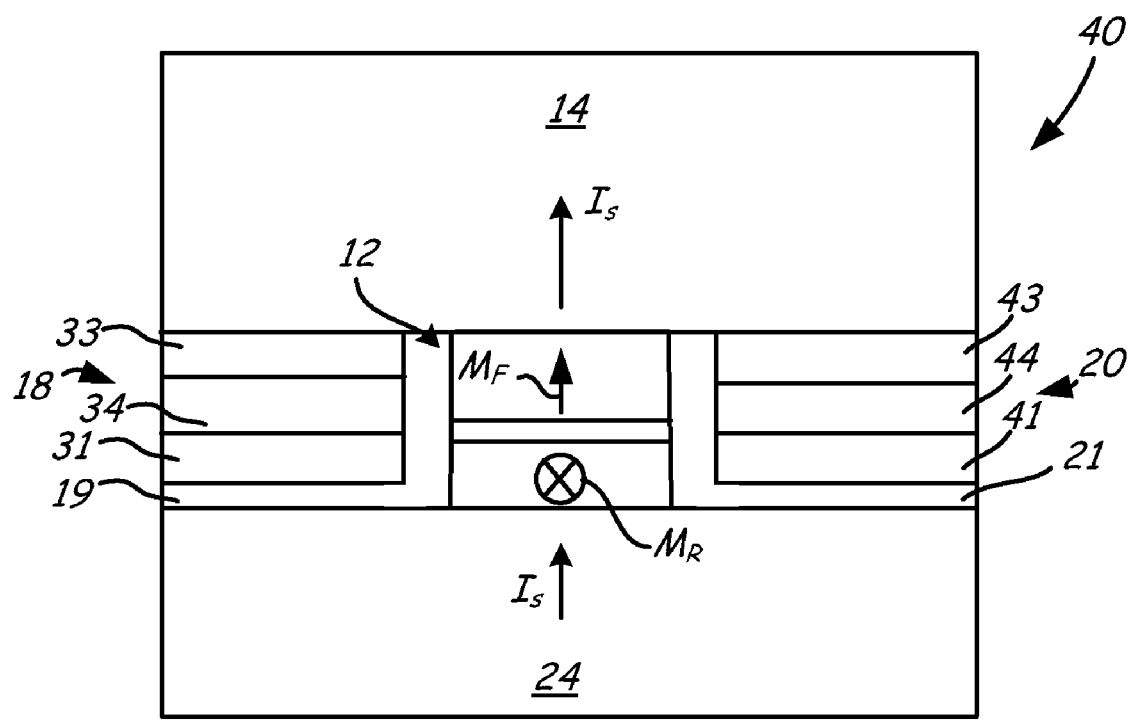
FIG. 3 is a front surface view of a tunneling magneto-resistive (TMR) reader including a free layer assembly having a perpendicular to the plane anisotropy and composite side shields.

FIG. 3 is a front surface view of a tunneling magneto-resistive (TMR) reader 40 including a free layer assembly having a perpendicular to the plane anisotropy and composite side shields 18, 20. The tunneling magneto-resistive (TMR) reader 40 includes a sensor stack 12 separating a top magnetic shield 14 from a bottom magnetic shield 24. The sensor stack 12 includes a reference magnetic element having a reference magnetization orientation $M_R$ direction a free magnetic element having a free magnetization orientation $M_F$ direction substantially perpendicular to the reference magnetization orientation $M_R$ direction, and a non-magnetic spacer layer separating the reference magnetic element from the free magnetic element. As described above.

A first composite side magnetic shield 18 and a second composite side magnetic shield 20 are disposed between the top magnetic shield 14 and the bottom magnetic shield 24. The sensor stack 12 is between the first composite side magnetic shield 18 and the second composite side magnetic shield 20, and the first composite side magnetic shield 18 and the second composite side magnetic shield 20 include an electrically insulating layer 19, 21 electrically insulating the top magnetic shield 14 from a bottom magnetic shield 24.

In the embodiment shown the composite side magnetic shields include two or more layers magnetic layers separated by non-magnetic spacer layers. For example, the first composite side magnetic shield 18 includes a first magnetic layer 31 and a second magnetic layer 33 separated by a non-magnetic spacer layer 34, and the second composite side magnetic shield 20 includes a first magnetic layer 41 and a second magnetic layer 43 separated by a non-magnetic spacer layer 44. In some embodiments the non-magnetic spacer layer 34, 44 is a nonmagnetic, conductive material, such as Cu, Ag, Au, or Ru. In other embodiments, the non-magnetic spacer layer 34, 44 is a non-magnetic, insulative or semi-conductive material, such as oxides formed of Mg, Al, Hf, or Ti. Non-magnetic, insulative or semi-conductive the non-magnetic spacer layers 34, 44, assist the electrically insulating layer 19, 21 in electrically isolating the top magnetic shield 14 from the bottom magnetic shield 24.

Figure 4:
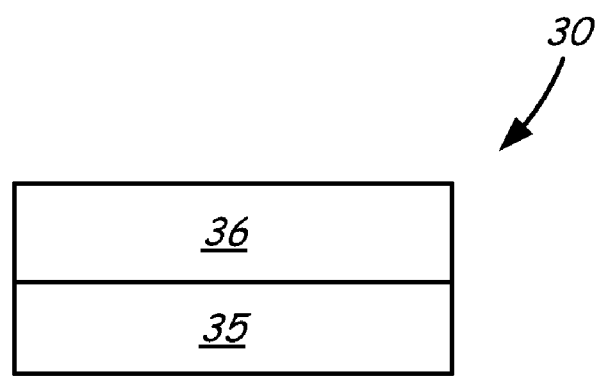
FIG. 4 is a layer diagram of a composite free layer element.

FIG. 4 is a layer diagram of a composite free magnetic element 30. The free magnetic elements 30 described herein can be a composite free magnetic element 30. The composite free magnetic element 30 can include a first layer 35 of CoFeB material and a second layer 36 of TbCoFe material. There are other materials in addition to the TbCoFe that can be utilized to provide perpendicular anisotropy. A listing of these materials includes FePt, CoPt, Co/Pt multilayers, Co/Pd multilayers, Co/Cu multilayers, Co/Au multilayers, Co/Ni multilayers, and MnAl, for example. In many embodiments, the first layer 35 is in contact with the spacer layer (32 in FIG. 1) is believed to be responsible for the TMR effect. In addition the TbCoFe material is believed to create the perpendicular anisotropy. A strong exchange coupling between the first layer 35 and second layer 36 materials insures that the first layer 35 magnetization in the composite free magnetic element 30 is perpendicular to the plane of the composite free magnetic element 30.

Figure 5:
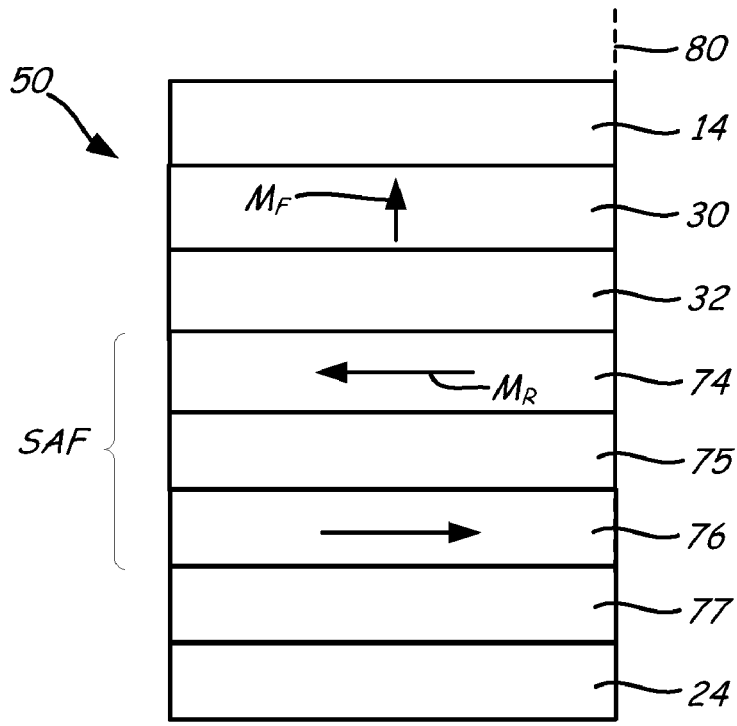
FIG. 5 is a cross-sectional schematic diagram of a sensor stack including a reference magnetic element having a synthetic antiferromagnet and antiferromagnetic layer and a free magnetic element having a perpendicular to the plane anisotropy.

FIG. 5 is a cross-sectional schematic diagram of a sensor stack 50 including a reference layer having a synthetic antiferromagnet SAF and antiferromagnetic layer 77 and a free magnetic element 30 having a perpendicular to the plane anisotropy. Top and bottom leads/shields 14 and 24, free magnetic element 30, spacer layer 32, and reference magnetic element 74, 75, 76, 77, define front surface 80. In some embodiments, front surface 80 is substantially planar. The front surface 80, or air bearing surface (ABS) faces, for example, magnetic media that is sensed by the sensor stack 50.

In this embodiment, the synthetic antiferromagnet SAF is stabilized by the antiferromagnetic layer 77. The synthetic antiferromagnet SAF can be, for example, two ferromagnetic layers 74, 76 coupled by a nonmagnetic, electrically conductive spacer layer 75, such as Ru. Ferromagnetic layers of synthetic antiferromagnet SAF can be, for example, made of a ferromagnetic alloy, such as CoFe, NiFe, or NiFeCo, and the antiferromagnetic layer 77 may be made of PtMn, IrMn, NiMn, or FeMn.

Figure 6:
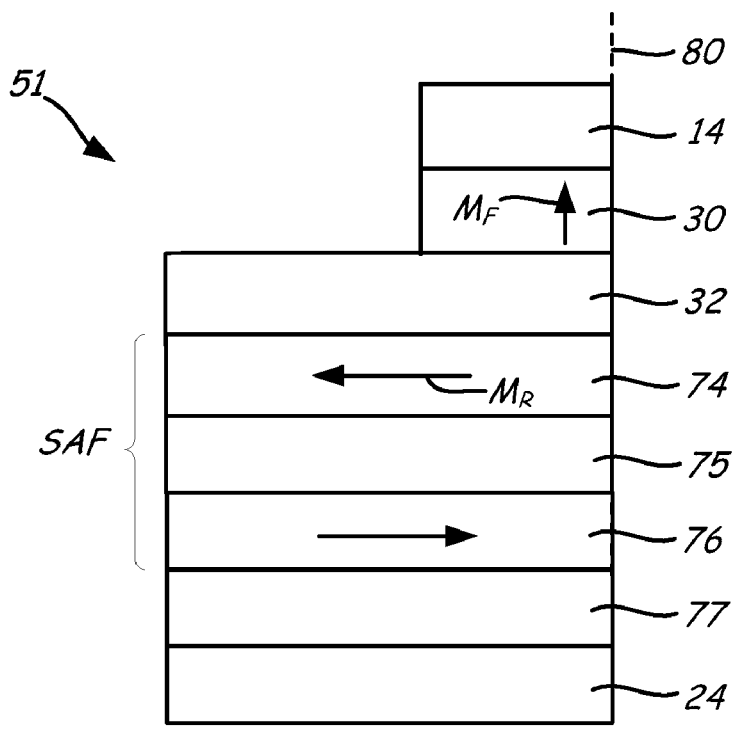
FIG. 6 is a cross-sectional schematic diagram of a sensor stack including an extended reference magnetic element having a synthetic antiferromagnet and antiferromagnetic layer and a free magnetic element having a perpendicular to the plane anisotropy.

FIG. 6 is a cross-sectional schematic diagram of a sensor stack 51 including an extended magnetic reference element 74, 75, 76, 77, having a synthetic antiferromagnet SAF and antiferromagnetic layer 77 and a free magnetic element 30 having a perpendicular to the plane anisotropy. Top and bottom leads/shields 14 and 24, free magnetic element 30, spacer layer 32, and reference magnetic element 74, 75, 76, 77, define front surface 80. In some embodiments, front surface 80 is substantially planar. The front surface 80, or air bearing surface (ABS) faces, for example, magnetic media that is sensed by the sensor stack 51.

In this embodiment, the synthetic antiferromagnet SAF is stabilized by the antiferromagnetic layer 77. The synthetic antiferromagnet SAF can be, for example, two ferromagnetic layers 74, 76 coupled by a nonmagnetic, electrically conductive spacer layer 75, such as Ru. Ferromagnetic layers of synthetic antiferromagnet SAF can be, for example, made of a ferromagnetic alloy, such as CoFe, NiFe, or NiFeCo, and the antiferromagnetic layer 77 may be made of PtMn, IrMn, NiMn, or FeMn.

In this embodiment, the magnetic reference element 74, 75, 76, 77 extends a larger distance away from the front surface than the free magnetic element 30 having a perpendicular to the plane anisotropy. In other words, the free magnetic element 30 has a length that is less than the length of the magnetic reference element 74, 75, 76, 77. This improves the magnetic stability of the synthetic antiferromagnet SAF.

Figure 7:
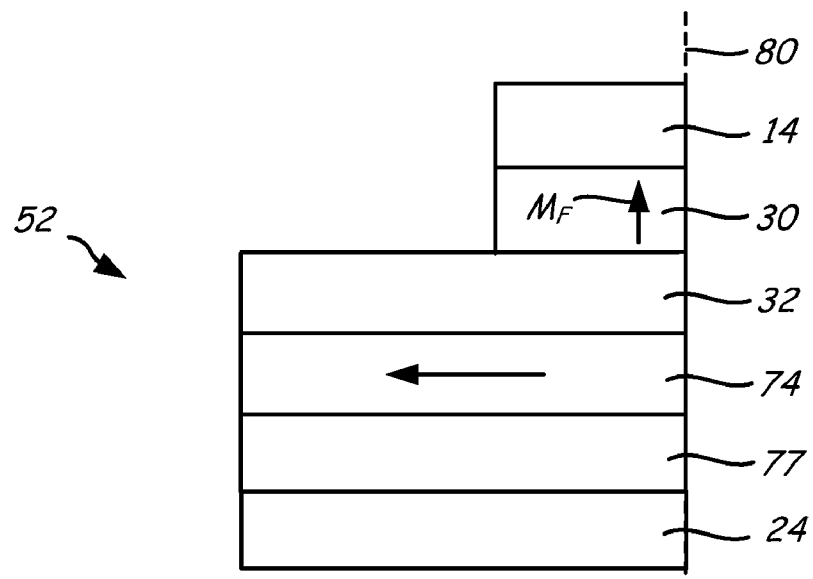
FIG. 7 is a cross-sectional schematic diagram of a sensor stack including an extended reference magnetic element having a pinned layer and antiferromagnetic layer and a free magnetic element having a perpendicular to the plane anisotropy.

FIG. 7 is a cross-sectional schematic diagram of a sensor stack 52 including an extended reference magnetic element having a pinned layer 74 and antiferromagnetic layer 77 and a free magnetic element 30 having a perpendicular to the plane anisotropy. Top and bottom leads/shields 14 and 24, free magnetic element 30, spacer layer 32, and reference magnetic element 74, 77, define front surface 80. In some embodiments, front surface 80 is substantially planar. The front surface 80, or air bearing surface (ABS) faces, for example, magnetic media that is sensed by the sensor stack 52.

In this embodiment, the magnetic reference element includes a single pinned layer 74 that has a length that is greater than the length of the free magnetic element 30. The single pinned layer 74 is stabilized by an antiferromagnetic layer 77. The extended single pinned layer 74 the in-plane magnetic field from the pinned layer acting on the free magnetic element 30 will be small and will not change its angle substantially from the perpendicular direction.

Figure 8:
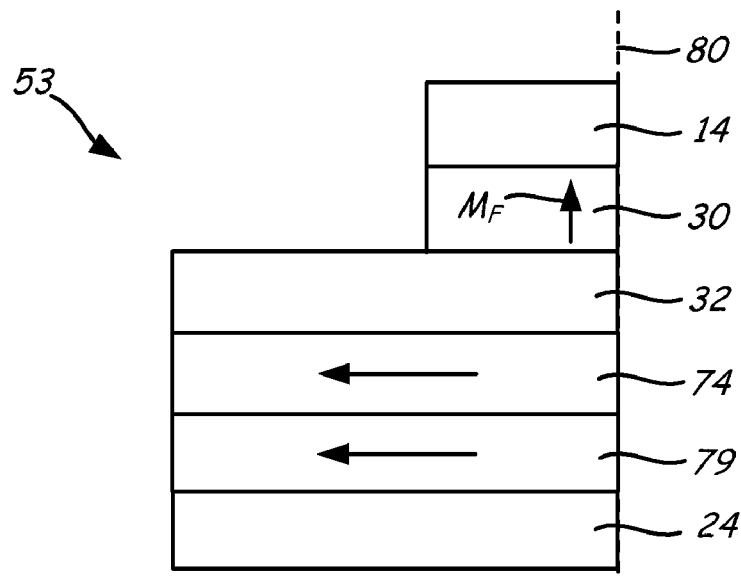
FIG. 8 is a cross-sectional schematic diagram of a sensor stack including an extended reference magnetic element having a pinned layer and a hard magnetic layer and a free magnetic element having a perpendicular to the plane anisotropy.

FIG. 8 is a cross-sectional schematic diagram of a sensor stack 53 including an extended reference magnetic element having a pinned layer 74 and a hard magnetic layer 79 and a free magnetic element 30 having a perpendicular to the plane anisotropy. Top and bottom leads/shields 14 and 24, free magnetic element 30, spacer layer 32, and reference magnetic element 74, 79, define front surface 80. In some embodiments, front surface 80 is substantially planar. The front surface 80, or air bearing surface (ABS) faces, for example, magnetic media that is sensed by the sensor stack 53.

In this embodiment, the magnetic reference element includes a single pinned layer 74 that has a length that is greater than the length of the free magnetic element 30. The single pinned layer 74 is stabilized by a hard magnetic layer 79. The extended single pinned layer 74 the in-plane magnetic field from the pinned layer acting on the free magnetic element 30 will be small and will not change its angle substantially from the perpendicular direction. The extended single pinned layer 74 can be formed of ferromagnetic material such as, CoFeB for a large TMR, wile the hard magnetic layer can be formed of materials with a large in-place Hk and Hc like, CoPt, CoCrPt, and/or FePt.

Thus, embodiments of the MAGNETIC SENSOR WITH PERPENDICULAR ANISOTROPY FREE LAYER AND SIDE SHIELDS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A tunneling magneto-resistive reader comprising:
a sensor stack separating a top magnetic shield from a bottom magnetic shield, the sensor stack comprising a reference magnetic element having a reference magnetization orientation direction a free magnetic element having a free magnetization orientation direction substantially perpendicular to the reference magnetization orientation direction, and a non-magnetic spacer layer separating the reference magnetic element from the free magnetic element; and
a first side magnetic shield and a second side magnetic shield disposed between the top magnetic shield from a bottom magnetic shield, and the sensor stack between the first side magnetic shield and the second side magnetic shield, and the first side magnetic shield and the second side magnetic shield comprise an electrically insulating layer electrically insulating the top magnetic shield from a bottom magnetic shield.

2. A tunneling magneto-resistive reader according to claim 1, wherein the free magnetic element comprises a layer of CoFeB and a layer of TbCoFe, FePt, CoPt, or MnA1.

3. A tunneling magneto-resistive reader according to claim 1, wherein the non-magnetic spacer layer is an oxide material.

4. A tunneling magneto-resistive reader according to claim 1, wherein the reference magnetic element comprises a synthetic antiferromagnet stabilized with an antiferromagnetic layer.

5. A tunneling magneto-resistive reader according to claim 1, wherein the free magnetic layer has a length that is less than a length of the reference magnetic element.

6. A tunneling magneto-resistive reader according to claim 1, wherein the reference magnetic element comprises a pinned layer stabilized with an antiferromagnetic layer.

7. A tunneling magneto-resistive reader according to claim 6, wherein the free magnetic layer has a length that is less than a length of the reference magnetic element.

8. A tunneling magneto-resistive reader according to claim 1, wherein the reference magnetic element comprises a pinned layer stabilized with a hard magnetic layer.

9. A tunneling magneto-resistive reader according to claim 8, wherein the free magnetic layer has a length that is less than a length of the reference magnetic element.

10. A tunneling magneto-resistive reader according to claim 8, wherein the pinned layer comprises CoFeB and the hard magnetic layer comprises CoPt, CoCrPt, or FePt.

11. A tunneling magneto-resistive reader according to claim 1, wherein the first side magnetic shield and a second side magnetic shield comprise a plurality of magnetic layers separated by non-magnetic spacer layers.

12. A tunneling magneto-resistive reader according to claim 1, wherein the non-magnetic spacer layers are electrically insulating.

13. A tunneling magneto-resistive reader according to claim 1, wherein the non-magnetic spacer layers are electrically conducting.

14. A tunneling magneto-resistive reader comprising:
a sensor stack between a top magnetic shield from a bottom magnetic shield, the sensor stack comprising a reference magnetic element having a reference magnetization orientation direction a free magnetic element having a free magnetization orientation direction substantially perpendicular to the reference magnetization orientation direction, and a non-magnetic spacer layer separating the reference magnetic element from the free magnetic element; and
a first side magnetic shield and a second side magnetic shield separating the top magnetic shield from a bottom magnetic shield, and the sensor stack between the first side magnetic shield and the second side magnetic shield, and the first side magnetic shield and the second side magnetic shield comprise two or more magnetic layers separated by spacer layer.

15. A tunneling magneto-resistive reader according to claim 14, wherein the non-magnetic spacer layers are electrically insulating.

16. A tunneling magneto-resistive reader according to claim 14, wherein the non-magnetic spacer layers are electrically conducting.

17. A tunneling magneto-resistive reader according to claim 14, wherein the free magnetic layer has a length that is less than a length of the reference magnetic element.

18. A tunneling magneto-resistive reader comprising:
a sensor stack between a top magnetic shield from a bottom magnetic shield, the sensor stack comprising a reference magnetic element having a reference magnetization orientation direction a free magnetic element having a free magnetization orientation direction substantially perpendicular to the reference magnetization orientation direction, and a non-magnetic spacer layer separating the reference magnetic element from the free magnetic element, the reference magnetic element comprising two or more magnetic layers; and
a first side magnetic shield and a second side magnetic shield separating the top magnetic shield from a bottom magnetic shield, and the sensor stack between the first side magnetic shield and the second side magnetic shield, and the first side magnetic shield and the second side magnetic shield comprise two or more magnetic layers separated by spacer layer.

19. A tunneling magneto-resistive reader according to claim 18, wherein the reference magnetic element comprises a synthetic antiferromagnet stabilized with an antiferromagnetic layer.

20. A tunneling magneto-resistive reader according to claim 18, wherein the reference magnetic element comprises a pinned layer stabilized with a hard magnetic layer.

* * * * *

UNITED STATES PATENT AND TRADEMARK OFFICE
CERTIFICATE OF CORRECTION

| | |
|---|---|
| PATENT NO. | : 8,125,746 B2 |
| APPLICATION NO. | : 12/502204 |
| DATED | : February 28, 2012 |
| INVENTOR(S) | : Dimitrov et al. |

Page 1 of 1

It is certified that error appears in the above-identified patent and that said Letters Patent is hereby corrected as shown below:

On the Title Page, Item [54] and in the Specification, Column 1, line 1-3, Title Delete "MAGNETIC SENSOR WITH PERPENDICULAR ANISTROPHY FREE LAYER AND SIDE SHIELDS" and insert --MAGNETIC SENSOR WITH PERPENDICULAR ANISOTROPY FREE LAYER AND SIDE SHIELDS--

Signed and Sealed this
Twelfth Day of November, 2013

Teresa Stanek Rea
*Deputy Director of the United States Patent and Trademark Office*